(12) United States Patent
Fischer et al.

(10) Patent No.: US 7,719,062 B2
(45) Date of Patent: May 18, 2010

(54) TUNED TENSILE STRESS LOW RESISTIVITY SLOT CONTACT STRUCTURE FOR N-TYPE TRANSISTOR PERFORMANCE ENHANCEMENT

(75) Inventors: Kevin J. Fischer, Hillsboro, OR (US); Vinay B. Chikarmane, Portland, OR (US); Brennan L. Peterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 617 days.

(21) Appl. No.: 11/647,977

(22) Filed: Dec. 29, 2006

(65) Prior Publication Data

US 2008/0157224 A1    Jul. 3, 2008

(51) Int. Cl.
    *H01L 23/48*    (2006.01)
(52) U.S. Cl. .................. 257/382; 257/751; 438/643; 438/653
(58) Field of Classification Search .......... 257/382, 257/383, 384, 751; 438/643, 644, 653, 654
    See application file for complete search history.

(56) References Cited

U.S. PATENT DOCUMENTS

| | | | |
|---|---|---|---|
| 6,087,706 A | 7/2000 | Dawson et al. | |
| 6,621,131 B2 | 9/2003 | Murthy et al. | |
| 6,790,773 B1* | 9/2004 | Drewery et al. | 438/643 |
| 6,881,667 B2* | 4/2005 | Sandhu et al. | 438/637 |
| 7,183,207 B2* | 2/2007 | Kang et al. | 438/680 |
| 7,410,875 B2* | 8/2008 | Ting et al. | 438/300 |
| 2003/0075752 A1 | 4/2003 | Motoyama | |
| 2006/0131662 A1* | 6/2006 | Yamada et al. | 257/374 |
| 2007/0228482 A1 | 10/2007 | Wei et al. | |

OTHER PUBLICATIONS

Intel Corporation Office Action for U.S. Appl. No. 11/648,098 mailed Jun. 24, 2009.

\* cited by examiner

*Primary Examiner*—Zandra Smith
*Assistant Examiner*—Christy L Novacek
(74) *Attorney, Agent, or Firm*—Blakely, Sokoloff, Taylor & Zafman LLP

(57) ABSTRACT

A method for forming a slot contact structure for n-type transistor performance enhancement. A slot contact opening is formed to expose a contact region, and a barrier plug is disposed within a portion of the slot contact opening in order to induce a tensile stress on an adjacent channel region. The remainder of the slot contact opening is filled with a lower resistivity contact metal. Barrier plug deposition temperature can be varied in order to tune the tensile stress on the adjacent channel region.

21 Claims, 12 Drawing Sheets

| SLOT CONTACT STRUCTURE | 40nm Width (Cw) | | 60nm Width (Cw) | | 76nm Width (Cw) | |
|---|---|---|---|---|---|---|
| | Resistivity (Ohm/μm) | % Reduction | Resistivity (Ohm/μm) | % Reduction | Resistivity (Ohm/μm) | % Reduction |
| TNT (150angtroms TaN) (150angtroms Ta) Cu Fill | 5.33 | 85.0 | 3.94 | 84.2 | 3.19 | 83.7 |

FIG. 4

| Film | Intrinsic Stress (dyne/cm$^2$) |
|---|---|
| 200A TaN | -1.97E+10 |
| 200A Ta | -1.81E+10 |
| 200A Ta low bias | -2.29E+10 |
| 250A TNT* | -1.36E+10 |
| 200A TNT* low bias | -2.05E+10 |
| 500A Cu** | 6.19E+8 |
| 175A TNT* + 1525 Cu* | -3.30E+9 |

** Cu electrolessly deposited on Ta wetting layer
* TNT comprised of 100A TaN, remainder is Ta

TUNED TENSILE STRESS LOW RESISTIVITY SLOT CONTACT STRUCTURE FOR N-TYPE TRANSISTOR PERFORMANCE ENHANCEMENT

BACKGROUND OF THE INVENTION

1. Field of the Invention

The present invention relates to the field of semiconductor processing, and more specifically to novel contact structures and their method of fabrication.

2. Discussion of Related Art

Well-recognized improvements in performance, functionality and economy of manufacture have led to integrated circuit designs at extreme levels of device density and reduced size of electronic structures and conductive interconnections between them. As integrated circuits become smaller, the integrated circuit speed becomes dependent not only on the transistor but also on the interconnecting pattern.

Historically, continuous performance enhancement of integrated circuit design has been dictated by the advancement of optical photolithography tools and photoresist materials. However, as CMOS device size progresses further into the nano-sized regime, the associated cost of these new tools and materials can be prohibitive. And in addition to economic constraints, scaling is also quickly approaching constraints of device materials and design. Fundamental physical limits such as gate oxide leakage and source/drain extension resistance make continued minimization difficult to maintain.

Accordingly, researchers have actively sought out methods other than scaling to increase device performance. For example, researchers have increased device performance with implementation of silicon-on-insulator substrates, high-k gate dielectrics, and metal gates. Researchers have also investigated mobility enhancement in strained silicon as a method to improve CMOS performance. One proposed method has been to globally strain the silicon channel with a silicon-germanium virtual substrate. However, silicon-germanium virtual substrates are costly to manufacture. Another proposed method has been to locally strain the silicon channel with selectively deposited lattice-mismatched source and drain regions.

At present, most CMOS circuit manufacturers employ a contact via hole plug for connecting one terminal of a CMOS component to a metallic interconnect layer. Two advantages of the tungsten via hole plug over other materials are that tungsten may be deposited by CVD and also tungsten has relatively low electromigration into the surrounding silicon. However, tungsten also has a relatively high resistivity compared to metals typically employed in interconnect layers, such as copper. Accordingly, while tungsten is a favorable material for via hole plugs, its lateral resistance makes tungsten unfavorable as an interconnect metal. Thus, there remains a need for an integrated contact structure that both can increase device speed without adding additional steps and/or cost to manufacture, and also function as an interconnect layer without unfavorable lateral resistance.

BRIEF DESCRIPTION OF THE DRAWINGS

FIG. 4 is a table providing experimental data of contact line resistivity for slot contact lines of varying width.

DETAILED DESCRIPTION

Figure 1:
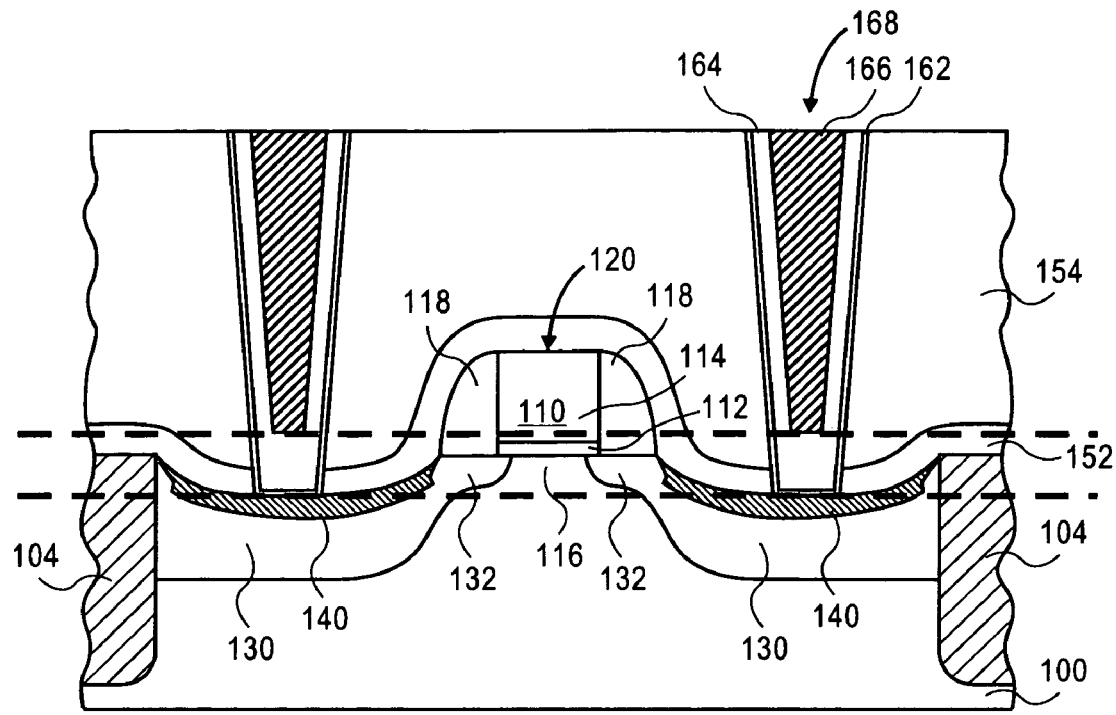
FIG. 1 illustrates a cross-sectional front view of an exemplary slot contact structure implemented with a surface channel MOSFET.

In various embodiments, a novel slot contract structure and method of fabrication is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention are directed towards a slot contact structure and method of fabrication in which the slot contact induces a stress on a device active region. Unlike the commonly employed via hole contact plug, in which the dimensions are determined by resolution limits of the lithographic wavelength employed, the slot contact embodiments of the present invention are described by a length and width tailored to be relative to device dimensions.

In one aspect, embodiments of the invention provide a slot contact that has a sufficient length and width to effectively induce a stress on an active device region, thereby increasing device performance. For example, when the device is a surface channel MOSFET, embodiments of the present invention provide slot contacts to the source and drain regions, the contacts being described by a length that runs along the width of the MOSFET. Where the width of the MOSFET is large, likewise the length of the slot contact is large so that the slot contact may effectively induce a stress across approximately the entire width of the MOSFET. In an embodiment, the slot contact is approximately as long as a single MOSFET width. The slot contact may also spread across multiple MOSFET devices. For example, in other embodiments, the slot contact is two, three, or four times longer than a single MOSFET width.

The slot contacts may be disposed in recessed source and drain regions. Alternatively, the slot contacts may be disposed on raised source and drain regions. Recessed source and drain regions allow for the lower portion of the slot contact to be adjacent to the device channel region so that the slot contact may more effectively induce a stress on the channel region. For example, where the device is a surface channel MOSFET, the active channel region of the device is directly below the gate oxide. Therefore, some embodiments described herein provide a stress inducing slot contact that extends below the gate dielectric layer such that a portion of the slot contact is adjacent to the device channel region and the slot contact may effectively induces a stress on the channel region. Accordingly, in certain embodiments, the MOSFET source and drain regions are recessed prior to formation of the stressed slot contacts.

The slot contacts may also be disposed on raised source and drain regions. When the source and drain regions are raised, the lower portion of the slot contact is above rather than adjacent to the device channel region and the slot contact may not effectively induce a stress on the channel region. Since NMOS and PMOS devices behave with opposite sign under applied transverse stress, a designer may want to increase the stress on one type of device (for example NMOS) and reduce the stress on the other type of device (for example PMOS). In an embodiment, this is accomplished by forming a slot contact in recessed source and drain regions for one device (for example NMOS) and forming a slot contact on raised source and drain regions for another device (for example PMOS).

In another aspect, embodiments of the invention provide a slot contact that may also function as an interconnect. The slot contact may be comprised of multiple materials. For example, the slot contact structure may comprise a stress inducing barrier plug in the lower portion, with the remainder of the slot contact structure being comprised of a low resistance contact metal. In some embodiments, the barrier plug is primarily responsible for inducing a stress on the device active region. However, the barrier plug may also possesses too high a resistivity to function as an interconnect metal. Thus, in a preferred embodiment, the slot contact is comprised of a minimum amount of higher resistance stress inducing barrier plug in the lower portion adjacent to the device active region, and the remainder of the slot contact is comprised of a maximum amount of low resistance contact metal.

Long channel drive gains of approximately 8% have been realized for both NMOS and PMOS devices employing embodiments of the present invention. While many embodiments herein are described in reference to a surface channel MOSFET device, this invention is also applicable to additional semiconductor devices such as, but not limited to, buried channel devices, MISFET, and non-planar devices such as FinFET and Tri-Gate. In addition, embodiments of the stress inducing slot contact structure provided herein are compatible with other stress inducing mechanisms such as, but not limited to, a stress inducing etch stop layer, selectively deposited lattice-mismatched source and drain regions, and stress inducing isolation regions. It will become apparent that by controlling slot contact location, size, and shape, that a slot contact can be created with the necessary dimensions and location relative to the device to stress the device active region.

FIG. 1 illustrates an exemplary slot contact structure implemented with a surface channel MOSFET. Surface channel transistor 120 is formed on a substrate 100. Any well-known substrate, such as but not limited to, a monocrystalline silicon or silicon on insulator can be used. In an embodiment substrate 100 comprises an epitaxial monocrystalline silicon layer formed on a monocrystalline wafer. The monocrystalline layer may also be doped. For example, where transistor 120 is a p-type device, the monocrystalline layer may include an n-type dopant. Where transistor 120 is an n-type device, the monocrystalline layer may include a p-type dopant. Isolation regions 104 are also formed in substrate 100. Isolation regions 104 may, for example, be shallow trench isolation regions. Isolation regions 104 may also be stressed and may be stressed in a way to optimally interact with the stress of the contact slot structure.

Gate dielectric 112 and gate electrode 114 comprise the gate stack 110 of transistor 120. Gate stack 110 defines channel region 116 thereunder. Dielectric spacers 118 are disposed along the sidewalls of the gate stack 110 and the upper surface of substrate 100. For example, dielectric spacers 118 may be single or multiple layer L-shaped dielectric spacers, the formation of which is known in the art. The gate stack and/or the dielectric spacers may also be stressed and may be stressed in a way to optimally interact with the stress of the contact slot structure.

Transistor 120 may include tip regions 132 in addition to source and drain regions 130. As shown in FIG. 1, tip regions 132 may extend below gate stack 110. Contact regions 140 may be a conductive material such as, but not limited to, nickel-silicide, cobalt-silicide, titanium-silicide, or any refractory metal silicide.

Dielectric layer 154 is disposed over transistor 120. Dielectric layer 154 may be silicon dioxide, possibly doped with phosphorus, boron/phosphorus, or arsenic, or alternatively low-k materials such as, but not limited to, carbon doped silicon dioxide or fluorinated oxide. Dielectric layer 154 is typically planarized. Additional dielectric layers may also be disposed over transistor 120. For example etch stop layer 152 may optionally be disposed over transistor 120 prior to disposing dielectric layer 154. Slot contacts 168 are formed in dielectric layer 154 and optional etch stop layer 152 so that slot contacts 168 make contact with contact regions 140. The dielectric layers may also be stressed and may be stressed in a way to optimally interact with the stress of the contact slot structure.

As shown in FIG. 1, slot contact 168 has a top surface approximately level with the top planarized surface of dielectric layer 154, a bottom surface in contact with a portion of contact region 140, and sidewalls. In a specific embodiment, slot contact 168 has a width ($C_W$) that is approximately 0.5 to 2 times as wide as the transistor 120 gate length ($G_L$), and slot contact 168 has a height approximately 3 to 4 times the transistor 120 gate length ($G_L$). For example, where transistor 120 has a 45 nm gate length, slot contact 168 may have an 80 nm width ($C_W$) at the top of dielectric layer 154 and a 160 nm height. In an embodiment, slot contact 168 sidewalls are tapered. It is not uncommon for a slight taper to be present even when dielectric layer 154 and optional layer 152 are isotropically etched. As a result, slot contact 168 may have a width ($C_W$) at the top of dielectric layer 154 that is different from where slot contact 168 contacts contact region 140. In one embodiment, slot contact 168 has a width ($C_W$) at the top of dielectric layer 154 that is approximately twice as wide as where slot contact 168 contacts contact region 140. In a specific embodiment, when transistor 120 has a 45 nm gate length, and slot contact 168 has an 80 nm width ($C_W$) at the top of dielectric layer 154 and a 160 nm height, slot contact 168 may have a 35 nm width ($C_W$) where slot contact 168 contacts contact region 140.

In one embodiment, source and drain regions 130 are recess etched. For example, source and drain regions 130 may be etched in a source drain wet clean process where the wet clean facets the source and drain regions 130 and recesses them. Contact regions 140, such as, but not limited to, nickel-silicide, cobalt-silicide, titatium-silicide, or any refractory metal-silicide, are then formed within the recessed source and drain regions 130. In an embodiment, slot contact 168 contacts the contact region 140 at a location below the gate dielectric layer 112 of gate stack 110. The depth of the location below the gate dielectric layer may depend on a variety of factors such as device dimensions, depth of channel region 116, and amount of stress to be induced on channel region 116. For a surface channel transistor, in order to most effectively induce a stress on channel region 116, slot contact 168 must be adjacent to the channel region 116, which means slot contact 168 must contact the contact region 140 at a sufficient depth below gate dielectric 112.

In an embodiment, when device 120 is a surface channel transistor, the location where slot contact 168 contacts the contact region 140 is a distance approximately 1% to 100% of the gate length ($G_L$) below gate dielectric layer 112. For example, in a specific embodiment when surface channel transistor 120 gate length is 45 nm, slot contact 168 contacts contact region 140 approximately 300 angstroms below gate dielectric layer 112, which is approximately 67% of the gate length. In another embodiment, between approximately 10% and 25% of the total height for slot contact 168 is located below gate dielectric layer 112. In a specific embodiment, 300 angstroms of a slot contact 168 with 160 nm height is located below gate dielectric layer 112, which is approximately 19% of the slot contact 168 height.

In some embodiments, slot contact 168 is comprised of barrier plug 164 and contact metal 166. Slot contact 168 may further comprise adhesion layer 162. In some embodiments, barrier plug 164 is largely concentrated in the bottom portion of slot contact 168. The amount of barrier plug 164 present is dependent on device dimensions, contact architecture, amount of stress to be induced on channel region 116, and allowable lateral resistance. In one embodiment, barrier plug 164 comprises less than 50% of the total volume of slot contact 168. In another embodiment, barrier plug 164 comprises less than approximately 25% of the total volume of slot contact 168.

In a specific embodiment, when transistor 120 has a 45 nm gate length and slot contact 168 has an 80 nm width at the top of dielectric layer 154 and a 160 nm height, barrier plug 164 may comprise approximately 300 angstroms of the bottom portion of slot contact 168 and approximately 70 angstroms of each sidewall. When an adhesion layer 162 is present, however, adhesion layer 162 may comprise a uniform 25 to 150 angstroms of the outermost bottom and sidewalls of slot contact 168. In another embodiment, adhesion layer may comprise a uniform 100 to 150 angstroms of the outermost bottom and sidewalls of slot contact 168. In a specific embodiment, barrier plug 164 and adhesion layer 162 together may comprise approximately 300 angstroms of the bottom portion of slot contact 168. The amount of each material will vary based on a variety of factors, such as, but not limited to, slot contact geometry and amount of stress to be induced.

In an embodiment, barrier plug 164 induces a stress on channel region 116. In another embodiment, barrier plug 164 is intrinsically stressed and induces a stress on channel region 116. For example, where barrier plug 164 is intrinsically tensile, barrier plug 164 induces a tensile stress on channel region 116. When barrier plug 164 is intrinsically compressive, barrier plug 164 induces a compressive stress on channel region 116. It is to be appreciated that barrier plug 164 most effectively induces a stress on channel region 116 when barrier plug 164 is adjacent to channel region 116. Thus, the further barrier plug 164 is either above or below channel region 116, the less effectively barrier plug 164 will induce a stress on channel region 116.

In one embodiment, barrier plug 164 and optional adhesion layer 162 fill the portion of slot contact 168 below the dielectric layer 112 for transistor 120 and are adjacent to channel region 116. In another embodiment, as shown by the dashed lines in FIG. 1, barrier plug 164 fills a portion of slot contact 168 both above and below the dielectric layer 112. In a specific embodiment where transistor 120 has a 45 nm gate length and slot contact 168 has an 80 nm width at the top of dielectric layer 154 and a 160 nm height, barrier plug 164 comprises approximately 300 angstroms of the bottom portion of slot contact 168 and barrier plug 164 is adjacent to channel region 116.

Stress inducing contact structure embodiments of the present invention are compatible with CMOS architecture. For example, as shown in FIG. 8, the source and drain regions of one device (for example PMOS) may be raised to minimize the slot contract stress on the device while the source and drain of the other device (for example NMOS) may be recessed to maximize the contact stress on the device.

Figure 8:
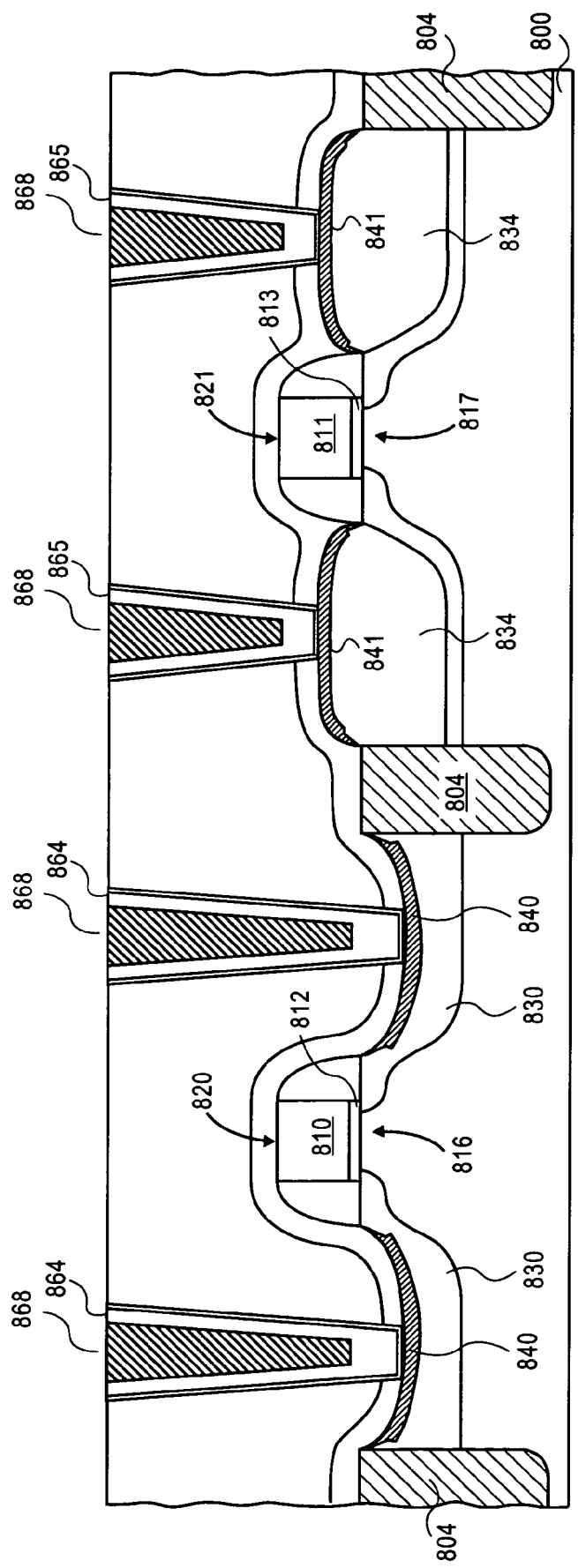
FIG. 8 illustrates a cross-sectional front view of an exemplary contact structure embodied in a CMOS architecture.

In one embodiment, as shown in FIG. 8, a slot contact 868 is formed within recessed source and drain region 830 of transistor 820. Slot contact 868 contacts the contact region 840 at a location below the gate dielectric layer 812 for transistor 820. As shown in FIG. 8, barrier plug 864 (and optional adhesion layer) fills the portion of slot contact 868 below the gate dielectric layer 812 for transistor 820 and is adjacent to channel region 816. In another embodiment, barrier plug 864 fills a portion of slot contact 868 both above and below the gate dielectric layer 812 for transistor 820.

In one embodiment, also shown in FIG. 8, slot contact 868 is formed on raised source and drain film 834 of transistor 821. Slot contact 868 contacts the contact region 841 at a location above the gate dielectric layer 813 for transistor 821, and therefore barrier plug 865 (and optional adhesion layer) is above channel region 817 rather than adjacent to channel region 817. Accordingly, barrier plug 865 may not effectively induce a stress on channel region 817.

Figure 2:
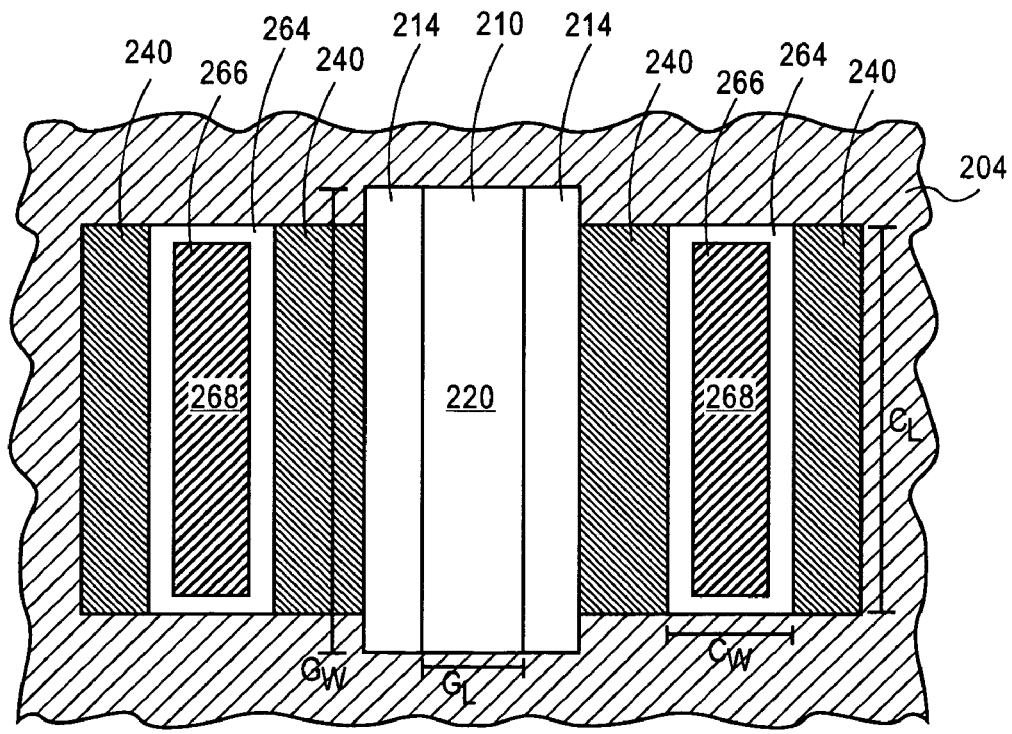
FIG. 2 illustrates a top view of the exemplary slot contact structure of FIG. 1.

FIG. 2 illustrates a top view of the exemplary slot contact structure of FIG. 1, wherein the length and width nomenclature for the exemplary slot contact structure and transistor are described. FIG. 2 shows transistor 220 (which is comprised of gate stack 210, dielectric spacers 214, and contact regions 240) slot contact 268 (which is comprised of barrier plug 264, optional adhesion layer (not shown) and contact metal 266) and isolation regions 204.

As shown in FIG. 2, the gate length ($G_L$) is defined by the length of gate stack 210 in the dimension between transistor 220 source and drain regions. The gate width ($G_W$) is defined by the width of gate stack 210. This is typically in the dimension that determines the total power or total current flow between the source and drain regions of transistor 220. Slot contact 268 has a length and width nomenclature reversed from that of transistor 220. As shown in FIG. 2, the slot contact length ($C_L$) is defined by the length of slot contact 268 in the direction of gate width. The slot contact width ($C_W$) is defined by the width of slot contact 268 in the direction of gate length.

As shown in FIG. 2, slot contact 268 may be approximately as long as the width of transistor 220 so that slot contact 268 is able to induce a stress across the entire width of transistor 220. Additionally, slot contact 268 may be longer that the width of transistor 220. In another embodiment, slot contact 268 is two, three, or four times longer than a single transistor 220 width. In other embodiments, slot contact 268 may be considerably longer depending on device layout.

Slot contact 268 width ($C_W$) may also be tailored to the dimensions of transistor 220. In one embodiment, slot contact 268 width ($C_W$) is approximately two times the transistor 220 gate length ($G_L$). In a specific embodiment where transistor 120 has a 45 nm gate length, slot contact 168 has an 80 nm width. In another embodiment, slot contact 268 is has a contact width ($C_W$) more than two times the transistor 220 gate length ($G_L$). The wider slot contact 268 is, the more stress slot contact 268 may induce on an adjacent channel region 116. In one embodiment, where slot contact 268 includes a stress inducing barrier plug 164, the wider slot contact 268 is the more stress inducing barrier plug 164 is present to induce a stress on adjacent channel region 116.

Figure 3:
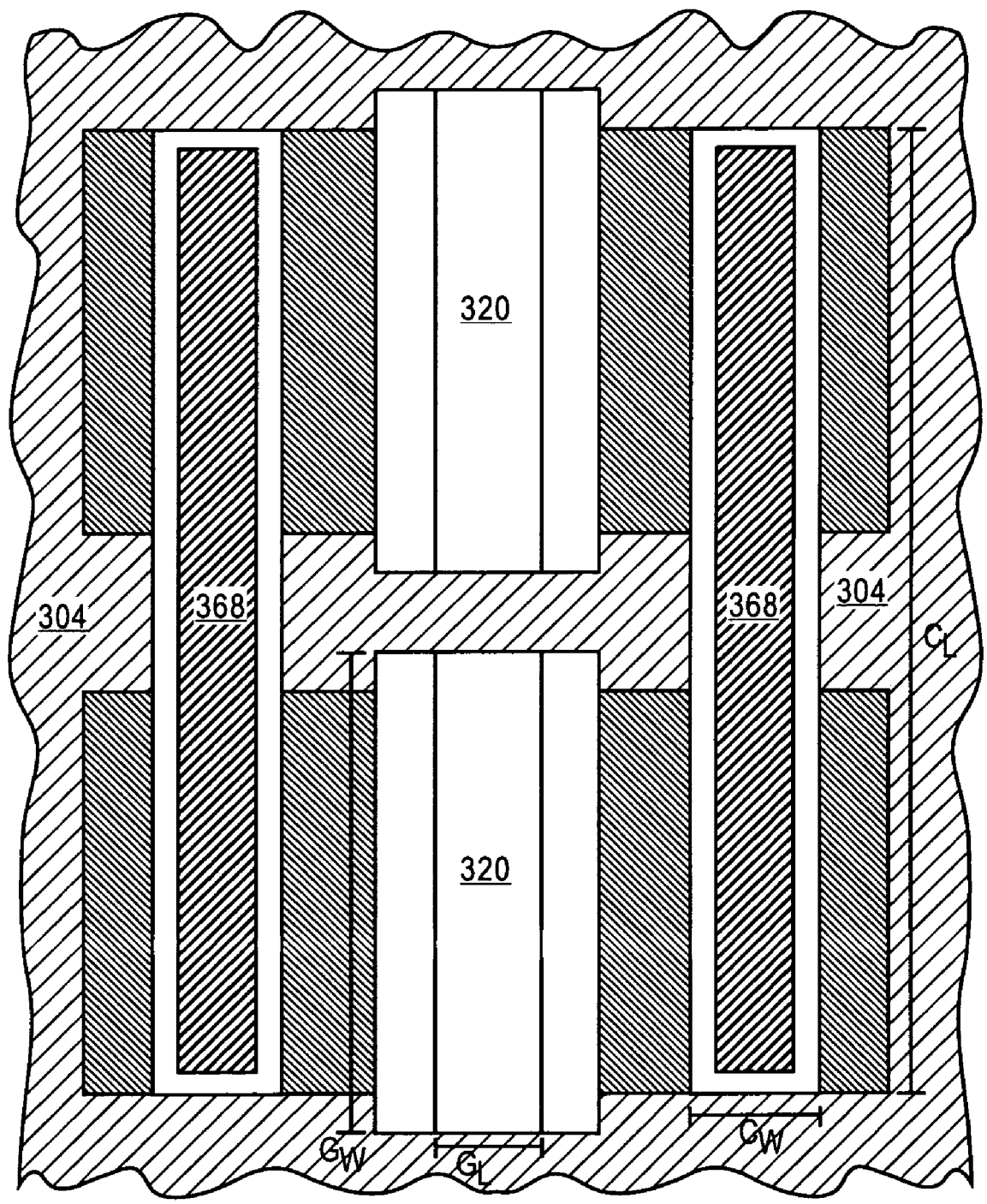
FIG. 3 illustrates a top view of an exemplary slot contact structure connecting at least two transistors.

FIG. 3 illustrates another embodiment of this invention where slot contact 368 also function as an interconnect between at least two transistors 320. As shown in FIG. 3, slot contacts 368 may additionally span across and make contact with isolation region 304 located between transistors 320. For example, isolation region 304 may be a shallow trench isolation or LOCOS. In one embodiment, as shown in FIG. 3, slot contact 368 length ($C_L$) spans across at least two transistors 320.

The ratio of barrier plug 364 to contact metal 366 is an important variable for controlling the resistivity of slot contact structure 368. Slot contact width ($C_W$) is an important parameter for controlling this ratio. In one embodiment slot contact width is greater than the minimum width determined by resolution limits of the lithographic wavelength employed. FIG. 4 provides resistivity measurements for slot contact structures with different widths fabricated in accordance with embodiments of this invention. As shown, slot contact structures with 40 nm, 60 nm, and 76 nm slot contact widths ($C_W$) were fabricated. Barrier plugs were comprised of a TaN and Ta bi-layer (TNT) which comprised approximately 300 angstroms (150 angstroms each) of the bottom portion of slot contact and approximately 70 angstroms of each sidewall (35 angstroms each). The remainder of the slot contacts were comprised of Cu contact metal. In each case resistivity measurements were reduced by greater than 80% compared to a slot contact comprised of a Ti/TiN adhesion layer (100 angstroms) and tungsten fill. The greater than 80% reduction in resistivity is attributed to the substitution of copper for tungsten as the primary conductive material in the slot contact. Small variations in the % reduction is considered noise among the samples.

Resistivity measurements for slot contact structures also decreased with increasing slot contact width ($C_W$). This correlation can be accorded to the slot contacts with a larger width containing a larger volume ratio of low resistivity contact metal to higher resistivity barrier plug. Thus, the greater the amount of low resistivity contact metal in the slot contact structure, the lower the lateral resistance, and hence the motivation to confine the barrier plug to the area where the barrier plug can induce a stress into the device active region. In some embodiments, the volume of contact metal 366 is greater than the volume of barrier plug 364 in the slot contact structure. In specific embodiments, the volume of contact metal 366 is greater than 75% of the overall volume of slot contact 368. For example, where the contact metal 366 is copper, slot contact 368 has an acceptable lateral resistance to function as an interconnect.

Figure 5A:
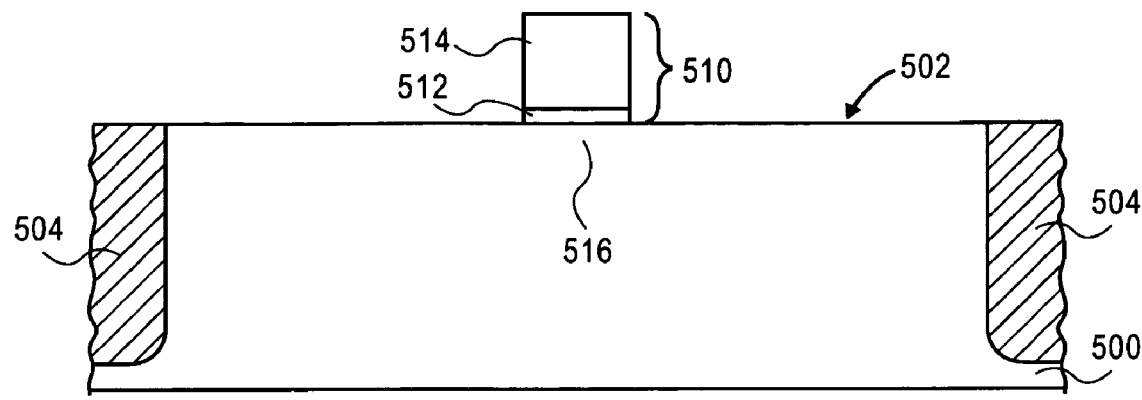
FIG. 5A illustrates a cross-sectional front view of an exemplary substrate, gate stack structure, and channel region in accordance with the present invention.

FIG. 5A illustrates a partially completed surface channel transistor. The process begins with a semiconductor substrate 500 having a top surface 502. In one embodiment, semiconductor substrate is comprised of a monocrystalline semiconductor layer having a top surface 502 formed on a monocrystalline wafer. The monocrystalline layer may, for example, be an epitaxial silicon layer formed on a monocrystalline silicon wafer, insulated substrate, or graded silicon-germanium virtual substrate. Substrate 500 may also be comprised of other well-known semiconductor materials such as germanium and III-V materials such as, but not limited to, InAs and GaAs. Substrate 500 may also be doped. For example, substrate 500 may include a monocrystalline layer with n-type well dopant where a p-type device is to be formed. Alternatively, substrate 500 may include a a monocrystalline layer with p-type well dopant where an n-type device is to be formed.

A plurality of isolation regions 504 are then formed in substrate 500. Isolation regions 504 isolate wells of different conductivity types, and isolate adjacent transistors. The isolation regions 504 may, for example, be shallow trench isolation (STI) regions formed by etching a trench into substrate 500, and then filling the trench with deposited oxide.

A gate dielectric layer 512 is then formed on a top surface 502 of substrate 500. The gate dielectric layer 512 may be a nitrided oxide layer formed to a thickness of between 1 and 30 angstroms or may be comprised of a high-k dielectric material such as $HfO_2$ or any combination of an oxide, nitrided oxide, or high-k dielectric material. A gate electrode 514 is then formed on the gate dielectric layer 512. Gate electrode 514 is preferable between 200 and 2,000 angstroms thick. In one embodiment, gate electrode may be formed by blanket deposition of polysilicon. The gate dielectric layer 512 and gate electrode 514 are then patterned using known photolithographic techniques and etched to form gate stack 510, defining the channel region 516 thereunder. In an exemplary embodiment, the gate stack 510 has a gate length of approximately 45 nm.

Figure 5B:
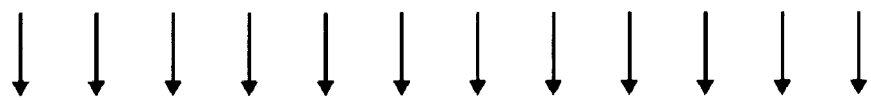
FIG. 5B illustrates a cross-sectional front view of formation of tip regions in accordance with the present invention.
Figure 5B:
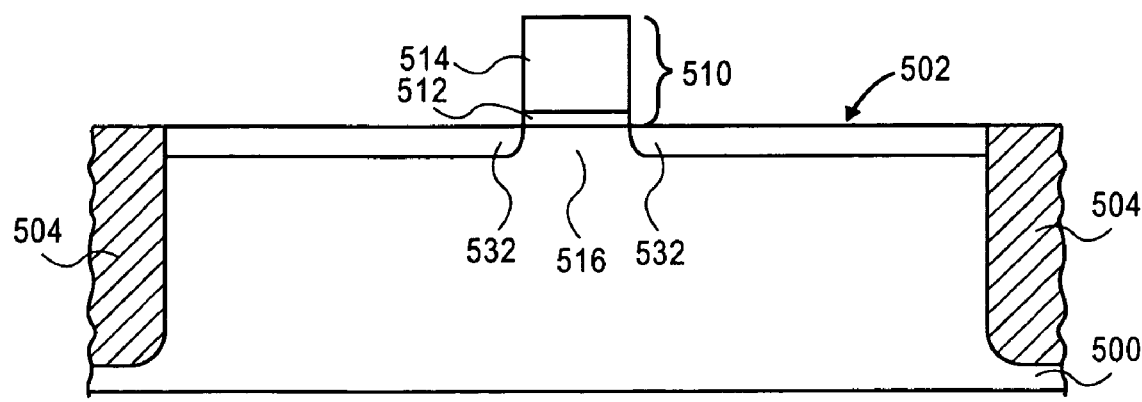

FIG. 5B illustrates that dopant ions are then subsequently implanted into an exposed upper surface of substrate 500 and into an exposed upper surface of gate electrode 514. Tip regions 532 are formed in the implanted region of substrate 500 on opposed sides of the gate stack 510. Where the transistor is p-type, the dopant ions may, for example, be boron ions. Where the transistor is n-type, the dopant ions may, for example, be phosphorus or arsenic.

Figure 5C:
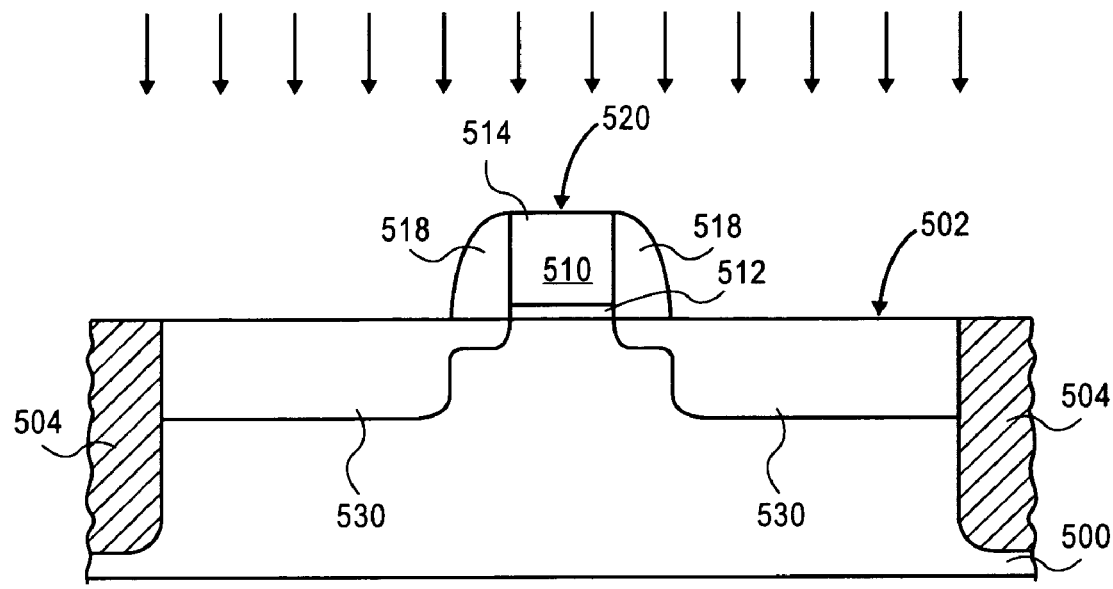
FIG. 5C illustrates a cross-sectional front view of formation of dielectric spacers and source and drain.regions in accordance with the present invention.

FIG. 5C illustrates the formation of dielectric spacers 518 on opposing sides of the gate stack 510. Dielectric spacers 518 also cover portions of the surface 502 adjacent and on opposing sides of the gate stack 510. In one embodiment, dielectric spacers 518 are formed by disposing a conformal insulating layer and anisotropically plasma etching it. Alternatively, dielectric spacers 518 may be multiple-layer L-shaped spacers, the formation of which is known in the art. Upper surfaces of the gate electrode 514 and the surface 502 are then again implanted with ions, with the implantation energy increased over the step of FIG. 5B so that the ions implant deeper into substrate 500 to form source and drain regions 530. The dielectric spacers 518 form a mask which prevents implantation of the ions into tip regions 532 below the dielectric spacers 518.

Figure 5D:
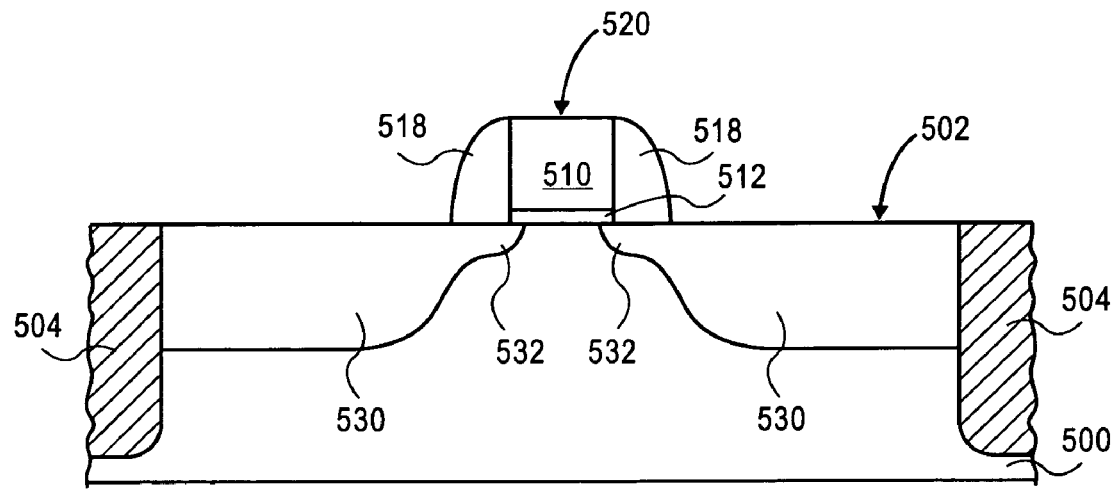
FIG. 5D illustrates a cross-sectional front view of diffused tip and source and drain regions in accordance with the present invention.

A heat treatment or annealing step is subsequently carried out, wherein the structure of FIG. 5C is heated. As shown in FIG. 5D, heating causes diffusion of the tip regions 532 and source and drain regions 530 into layer 500. Tip regions 532 diffuse slightly below the gate stack 510, and the lower edges of source and drain regions 530 move downward into substrate 500. Additionally, the doped region in gate electrode 514 also diffuses down to the gate dielectric layer 512.

Figure 5E:
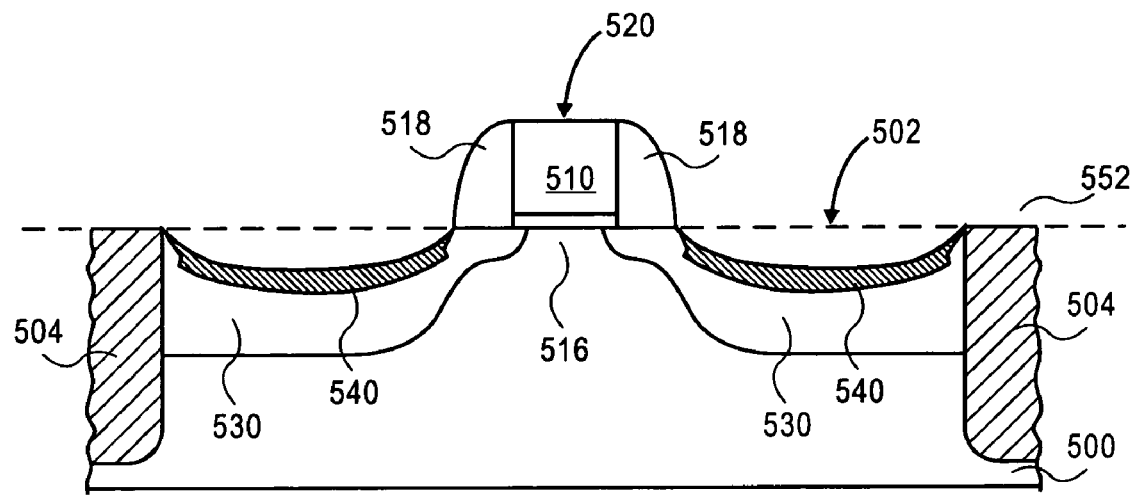
FIG. 5E illustrates a cross-sectional front view of the formation of recessed contact regions in accordance with the present invention.

FIG. 5E illustrates the formation of contact regions 540 on the source and drain regions 530. Contact regions 540 may be formed on the source and drain regions 530 using well-known processes. For example, such processes may include blanket deposition of a metallic film such as, but not limited to, Ni, Co, Ti, or any refractory metal. This is followed by an anneal step and selective removal of un-reacted metal (not shown), and possibly a second anneal. A hard mask (not shown), such as silicon nitride, may optionally be deposited on the gate stack 510 prior to deposition of the metallic film in order to shield the gate stack 510 from contact formation. In some embodiments where substrate 500 includes a monocrystalline silicon layer, contact regions 540 may be, for example, nickel-silicide, cobalt-silicide, titatium-silicide, or any refractory metal-silicide.

In another embodiment, the silicide process may be used to create a metal gate electrode architecture by fully siliciding the polysilicon gate stack (commonly called FUSI). Silicide materials include, but are not limited to nickel-silicide, cobalt-silicide, titatium-silicide, or any other refractory metal-silicide.

It is to be appreciated that embodiments of the present invention provide a slot contact that may induce a stress on an adjacent device active region. Accordingly, in some embodiments, stress is most effectively transferred to the channel region 516 of transistor 520 when the lower portion of the slot contact is adjacent to channel region 116. Therefore, while forming completed transistor 520, it is to be appreciated that the location where the slot contact will connect to contact region 540 is preferably adjacent to or below channel region 516. Thus, for certain embodiments, as shown in FIG. 5E, a portion of the source and drain regions 530 are recessed below the original substrate 500 surface 502, and are also recessed below the gate stack 510.

In one embodiment, recessing the source and drain regions takes advantage of the natural consumption of the monocrystalline substrate 500 during silicidation of contact regions 540. Thus, in one embodiment, a portion of substrate 500 in the source and drain regions 530 is naturally consumed. The natural consumption may result in the contact regions 530 being slightly recessed, with an upper surface of both contact regions 530 preferably below the gate stack 510.

In an alternative embodiment, source and drain regions 530 are recess etched prior to creation of contact regions 540. For example, source and drain regions 530 may be selectively etched using an etchant which selectively removes silicon over the other exposed materials of the structure of FIG. 5E. Thus, recesses are thereby etched into regions 530, and are aligned with the outer edges of dielectric spacers 518 and field isolation regions 504. In many embodiments recesses are etched isotropically. In one embodiment, a hydro-fluoride (HF) wet chemical etch commonly employed in the pre-clean process to remove any residual native oxide remaining on the source and drain contact areas can be used to form faceted recesses in source and drain regions 530. In one embodiment, source and drain regions 530 are recess etched, so that after formation of contact regions 540 a portion of the source and drain 530 recessed surfaces are located approximately 1% to 100% of transistor 520 gate length below the gate stack 510 and original surface 502. In a specific embodiment, when transistor 520 has a 45 nm gate length, source and drain regions 530 are recess etched so that a portion of the source and drain 530 recessed surfaces are located approximately 350 to 400 angstroms below the gate stack 510 and original surface 502. After formation of approximately 5 to 10 nm thick contact regions 540, a portion of contact regions 540 are then located approximately 300 angstroms below the lower surface of gate stack 510 and original surface 502.

Figure 5F:
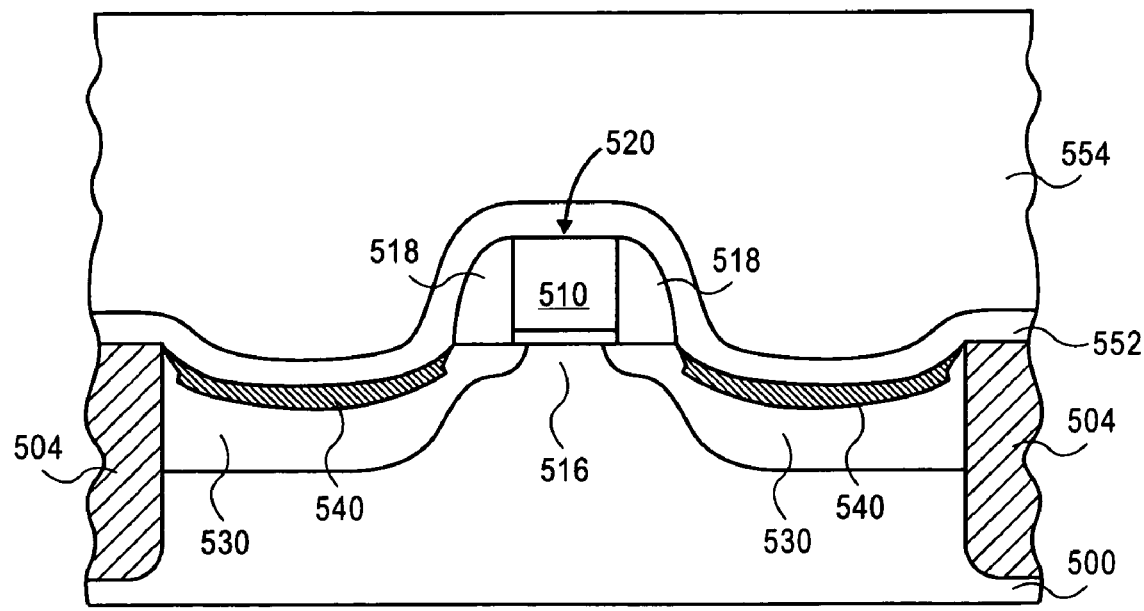
FIG. 5F illustrates a cross-sectional front view of dielectric layers disposed over the device of FIG. 5E.

FIG. 5F illustrates the formation of dielectric layers over transistor 520. Firstly, a conformal dielectric layer 552 may optionally be formed over transistor 520 and substrate 500. For example, conformal dielectric layer 552 may be a 10 to 200 nm thick $Si_3N_4$ or SiON etch stop/barrier layer deposited by CVD. Additionally, layer 552 may induce a tensile or compressive stress on transistor 520, the formation of which is known in the art. In addition, a pad oxide (not shown) may be disposed prior to layer 552 in order to alleviate stresses imparted to substrate 500 and transistor 520.

Next, interlevel dielectric (ILD) layer 554 is disposed over transistor 520 to provide insulation for the slot contacts and transistor 520. The ILD layer 554 is typically planarized using a chemical or mechanical polishing technique. Typically, for silicon-based semiconductor devices, dielectric materials for the ILD layer 554 are commonly silicon dioxide, possibly doped with phosphorus, boron/phosphorus, or arsenic, or low-k materials such as, but not limited to, carbon doped silicon dioxide or fluorinated oxide. All dielectric materials mentioned herein can be disposed by well-known conventional processes to the typical thickness employed in this technology. ILD layer 554 is then planarized using well-known conventional processes such as chemical-mechanical-polishing. In a specific embodiment, when transistor 520 has a 45 nm gate length, ILD layer 554 is approximately 160 nm thick.

It is to be appreciated that embodiments of the invention are compatible with replacement gate electrode architecture, which is well-known in the art. While not described in detail, the structure of FIG. 5F can be followed by a polish process which exposes the top surface of the gate electrode. The gate is then removed, and an alternative gate material is added. This gate material could be polysilicon, silicided polysilicon (include, but not limited to nickel-silicide, cobalt-silicide, titatium-silicide, or any other refractory metal-silicide), metal (including, but not limited to Ti, Al etc.) or a metal stack (including, but not limited to Ti, TiN, TiAl, and other metal alloys.)

Figure 5G:
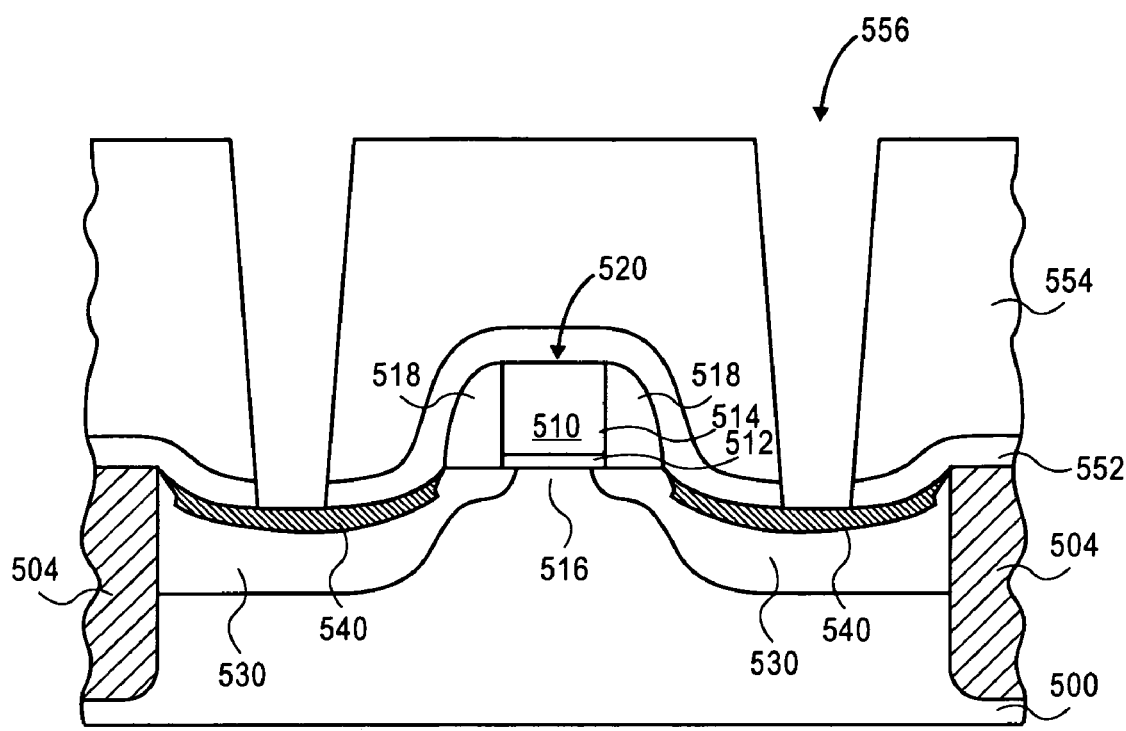
FIG. 5G illustrates a cross-sectional front view the formation of a contact opening in the dielectric layers of FIG. 5F.

FIG. 5G illustrates the formation of contact opening 556 in dielectric layers 552 and 554 to expose contact region 540. In some embodiments, the exposed portion of contact region 540 is preferably adjacent to or below channel region 516. Thus, for certain embodiments, exposed portion of contact region 540 is below the gate stack 510. In one embodiment, the exposed portion of contact region 540 is located approximately 1% to 100% of transistor 520 gate length below the gate stack 510. In a specific embodiment, when transistor 520 has a 45 nm gate length, the exposed portion of contact region 540 is approximately 300 angstroms below gate stack 510.

Contact opening 556 is also defined by a length. In one embodiment, a contact opening is formed in dielectric layer 556, where the contact opening 556 has a length approximately as long as the width of transistor 520. Additionally, contact opening 556 can be formed to be longer than the width of transistor 520. In another embodiment, contact opening 556 is two, three, or four times longer than a single transistor 520 width. In other embodiments, contact opening 556 may be considerably longer depending on device layout.

Figure 5H:
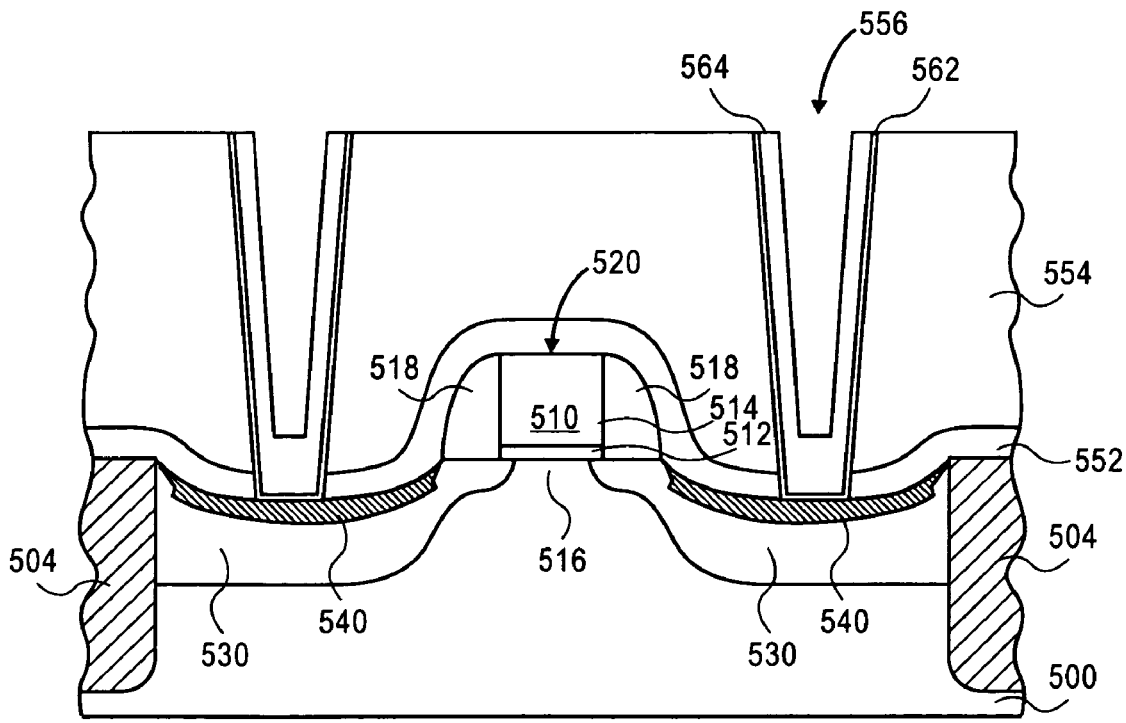
FIG. 5H illustrates a cross-sectional front view the formation of an adhesion layer and barrier plug disposed in the opening of FIG. 5G.
Figures 5I, 6:
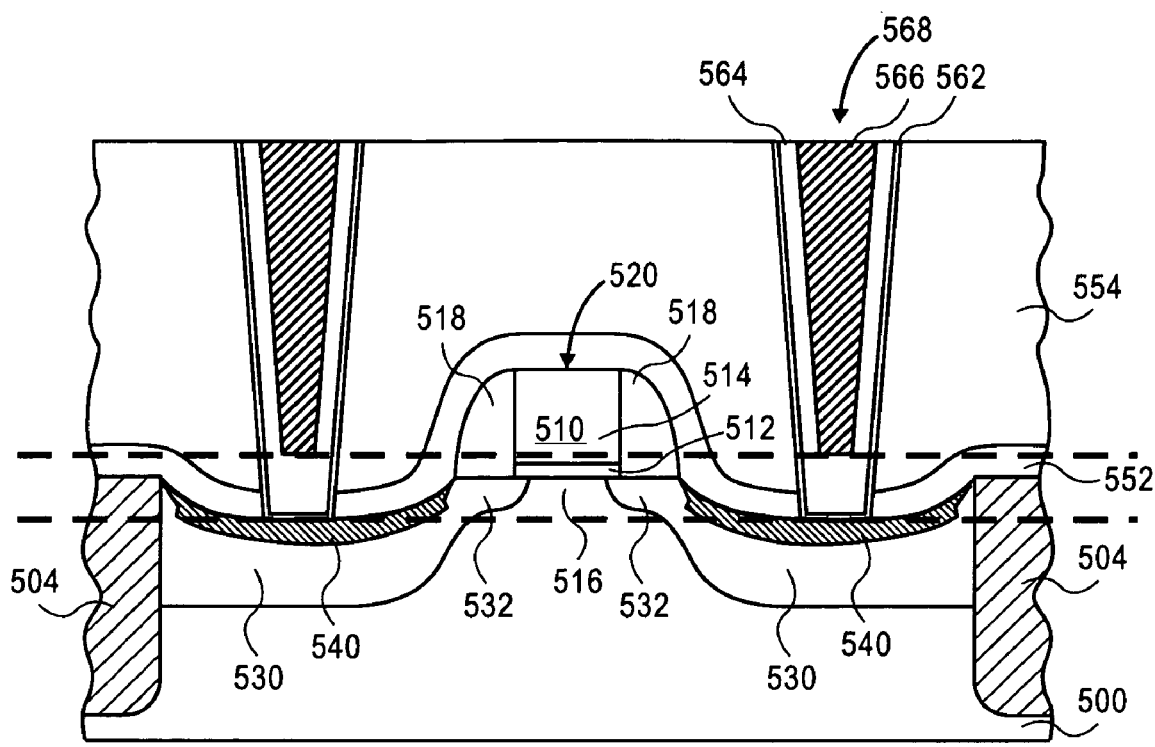
FIG. 5I illustrates a cross-sectional front view of an exemplary slot contact structure with the remaining portion of the opening of FIG. 5H filled with a contact metal.
FIG. 6 is a table providing experimental data for intrinsic stress measurements of RF sputtered layers deposited on a silicon wafer at room temperature.

Conventional photolithographic techniques and anisotropic plasma etching are used to form contact opening 556 in dielectric layer 554 and 552 to expose contact region 540. It is to be appreciated that the slot contact to be formed in contact opening 556 is described by the same length and width as the contact opening 556. Notably, as shown in FIGS. 5G-5I, contact opening 556 may have a different width at the top planarized surface of dielectric layer 554 than where contact opening 556 exposes contact region 540. Thus, the contact opening 556 width and correspondingly the contact opening 556 length, may change from the top to the bottom. Accordingly, unless specifically referred to otherwise, the width of contact opening 556 and corresponding slot contact width ($C_W$), and length of contact opening 556 and corresponding slot contact length ($C_L$), are in reference to the dimensions near the top planarized surface of dielectric layer 554.

FIG. 5H illustrates the formation of an optional adhesion layer 562 and barrier plug 564 within a portion of contact opening 556. In specific embodiments, adhesion layer 562 is disposed prior to disposing barrier plug 564 in order to provide a better surface for bonding and growth of barrier plug 564. As used herein, the terms barrier plug and adhesion layer are not meant to be limited to single materials or single layers. In some embodiments, adhesion layer 562 and/or barrier plug 564 may include multiple layers of different materials.

In some embodiments the barrier plug 564 fill process is such that it is a bottom-up fill process. The term bottom-up fill process as used herein means that the deposition process is anisotropic, where more material is deposited on the bottom of contact opening 564 than is deposited on a sidewall of contact opening 556. In some embodiments, barrier plug 564 is deposited using CVD techniques. In such embodiments the bottom-up fill process can be accomplished by controlling deposition temperature, pressure, and time. In other embodiments, barrier plug 564 is deposited using PVD techniques, such as but not limited to, RF sputtering. In such embodiments the bottom-up fill process can be accomplished by controlling deposition temperature, pressure, power, time, and re-sputter ratio.

The term re-sputter ratio as used herein, is defined as the ratio of the thickness of a film deposited on an unbiased substrate compared to the thickness of the film when deposited on a biased substrate. For example, applying a negative voltage to the substrate results in the depositing ions knocking off already deposited ions, and hence a thinner film per unit time of deposition occurs than for a film deposited without the negative voltage. Thus, when a sufficient negative voltage is applied to the substrate during sputtering, the kinetic energy of the depositing ions is also sufficient to sputter the film and redistribute it within features on the substrate. This leads to a thickening of the film in the bottom of contact opening 556. Accordingly, the re-sputter ratio is a useful variable for tuning a bottom-up fill process into features with differing geometries and aspect ratios.

Additionally, the bottom-up fill approach can be assisted by controlling the dimensions of contact opening 556. In particular, and as shown in FIG. 5G, contact opening 556 may have tapered sidewalls, where the width of contact opening 556 is greater at the top planarized surface of dielectric layer 554 than where contact opening 556 exposes contact region 540. In such a case, the narrower width at the bottom of contact opening 556 assists the bottom-up fill process where more material is deposited on the bottom than on the sidewalls contact opening 556.

In an embodiment, slot contact 568 induces a stress on channel region 516. In another embodiment, barrier plug 564 of slot contact 568 induces a stress on channel region 516. In a specific embodiment, barrier plug 564 possesses an intrinsic tensile or compressive stress. Where barrier plug 564 is intrinsically tensile, barrier plug 564 will induce a tensile stress on the channel region 516. A film deposited to possess an intrinsic tensile stress may relax by contracting, and by contracting the film induces a tensile stress on the surroundings. Conversely, a film deposited to possess an intrinsic compressive stress may relax by expanding, and by expanding the film induces a compressive stress on the surroundings. Thus, where barrier plug 564 is intrinsically compressive, barrier plug 564 induces a compressive stress on the channel region 516.

In one embodiment, barrier plug 564 is disposed within less than 50% of the total volume of contact opening 556. In another embodiment, barrier plug 564 is disposed within less than 25% of the total volume of contact opening 556. In one embodiment, barrier plug 564 is disposed within contact opening 556 such that a portion of barrier plug 564 is below gate dielectric layer 512. In yet another embodiment, barrier plug 564 is disposed within contact opening 556 such that a first portion of barrier plug 564 is below gate dielectric layer 512 and a second portion of barrier plug 564 is above gate dielectric layer 512.

In one embodiment, barrier plug 564 is intrinsically compressive and induces a compressive stress on channel region 516. Such intrinsically compressive plugs can serve to provide p-type transistor enhancement. In one embodiment the intrinsically compressive barrier plug 564 is comprised of a TaN and Ta (TNT) bi-layer. The TNT barrier plug 564 induces a compressive stress on channel region 516, and also functions to block migration of the subsequently deposited contact metal 566 (FIG. 5I) into the surrounding dielectric layers.

In a specific embodiment, when transistor 520 has a 45 nm gate length, a TNT bi-layer barrier plug 564 is RF sputter deposited into a 160 nm high by 80 nm wide contact opening 556. In such an embodiment, a first intrinsically compressive TaN film is RF sputter deposited into opening 556. Deposition parameters are approximately room temperature 25 C, pressure of 1.6-1.8 mTorr, DC power at 10-20 kW, RF power at 300-700 W, and resputter ratio at 1.0-1.2. In one embodiment, an exemplary TaN film fills approximately the bottom 10% of the total contact opening 556 height. In such an embodiment, the TaN film may fill the bottom 150 angstroms of contact opening 556 and be approximately 35 angstroms thick on the sidewalls of contact opening 556. The TaN film may have an intrinsic compressive stress of 1-4 E+10 dyne/cm2.

Following the TaN film, an intrinsically compressive Ta film is RF sputter deposited over the TaN film. Deposition parameters are approximately room temperature 25 C, pressure of 0.3-0.8 mTorr, DC power at 10-20 kW, RF power at 100-300 W, and resputter ratio at 1.0-1.2. In one embodiment, an exemplary Ta film fills approximately the next 10% of the total contact opening 556 height, which is above the TaN film. In such an embodiment, an exemplary Ta film may fill the bottom 150 angstroms of contact opening 556 remaining after deposition of the TaN film, and be approximately 35 angstroms thick on the new sidewalls of contact opening 556 after deposition of the TaN film. The Ta film may have an intrinsic compressive stress of 1-4 E+10 dyne/cm2. In such an embodiment, the composite TNT bi-layer barrier plug 564 is disposed within 10-25% of total height for contact opening 556. Thus, when contact opening 556 is 160 nm high and 80 nm wide, the composite TNT bi-layer barrier plug 564 is, for example, approximately 300 angstroms thick at the bottom of contact opening 556 (~19%) and approximately 70 angstroms wide on the sidewalls of contact opening 556.

In one embodiment, a TNT bi-layer barrier plug 564 is disposed within contact opening 556 such that a portion of TNT bi-layer barrier plug 564 is below gate dielectric layer 512 and adjacent to channel region 516. In yet another embodiment, additional TNT bi-layer barrier plug 564 is disposed within contact opening 556 such that a first portion of TNT bi-layer barrier plug 564 is below gate dielectric layer 512 and a second portion of TNT bi-layer barrier plug 564 is above gate dielectric layer 512.

FIG. 6 provides experimental data for intrinsic stress measurements of RF sputtered layers deposited at room temperature on a silicon wafer. Stress measurements were obtained using the change in bow of the wafer before and after film deposition according to Stoney's Equation. As shown in FIG. 6, TaN, Ta, and TNT films RF sputter deposited at room temperature have an intrinsic compressive stress on the order of E+10 dyne/cm2. In addition, FIG. 6 indicates that resputtering does not significantly affect resulting intrinsic stress. Measurements did not vary significantly from low bias deposition (low re-sputter ratio) and high bias deposition (high re-sputter ratio).

It is to be appreciated that sputter deposition temperature is a critical factor in controlling the intrinsic stress levels for barrier plug 556. For example, increasing the deposition temperature for the TNT barrier plug 564 to about 400 C results in a reduction of the intrinsic compressive stress to about 1-5 E+9 dyne/cm2.

FIG. 6 additionally provides measurements of the intrinsic stress for a 500 angstrom thick electrolessly deposited Cu layer as being 6.19E+8 dyne/cm2, which is slightly intrinsically tensile. This is two orders of magnitude less than the measured values on the order of E+10 dyne/cm2 for the barrier plug materials. Accordingly, it is to be appreciated that that the intrinsic stress of barrier plug 564 should be greater than that of the contact metal 566. Where Cu is employed as contact metal 566 (FIG. 1F), barrier plug 564, particularly when intrinsically compressive, preferably has an intrinsic stress of at least E+9 dyne/cm in order to drown out the effect of the intrinsic tensile Cu contact metal 566 stresses.

In one embodiment, barrier plug 564 is intrinsically tensile and induces a tensile stress on channel region 516. Such intrinsically tensile barrier plugs could serve to provide n-type transistor enhancement. In one embodiment, barrier plug 564 is CVD deposited tungsten (W) or tungsten nitride (WN), though other materials and methods can be used, such as but not limited to Mo and Cr. CVD tungsten is naturally intrinsically tensile, typically on the order to E+10 dyne/cm2, though it can be made higher or lower. Generally, the lower the deposition temperature, the more tensile tungsten will be, and the higher the deposition temperature, the less tensile.

In some specific embodiments employing W or WN as barrier plug 564 it may be necessary to deposit an adhesion layer first. In a specific embodiment, optional adhesion layer 562 is deposited prior to barrier plug 564, as shown in FIG. 5H. In a specific embodiment, adhesion layer 562 is comprised of a Ti and TiN bi-layer. In one embodiment, adhesion layer may have a thickness of approximately 5% to 10% of the contact opening 556 height, and 12% to 19% of contact opening 556 width. In a specific embodiment where contact opening is 160 nm high and 80 nm wide, a first, 50-80 angstrom thick Ti layer is sputter deposited on the surfaces of contact opening 556 at room temperature 25 C, 15-16 mTorr, and DC power of 1.8-2.0 kW. Although any available PVD technique is sufficient. The Ti layer contacts the silicide contact region 540 at the bottom of contact opening 556. If a native oxide has formed on the silicide, the Ti will reduce the oxide, and lower the contact resistance.

Next, a 50-70 angstrom thick TiN layer is deposited on the Ti layer with CVD at approximately 450 C and approximately 40 Torr using a tetra dimethyl amino titanium (TDMAT) precursor. The TiN functions to cut off contact off the Ti layer from the precursor used to deposit the subsequent tungsten plug material 564. Together the Ti and TiN layers comprise adhesion layer 562.

Then, a tungsten barrier plug 564 is deposited over adhesion layer 562 using a bottom-up fill approach. In one embodiment, the tungsten barrier plug 564 is deposited using a $WF_6H$ precursor in hydrogen ambient at temperature range of 325 C to 425 C and pressure of 30-50 mTorr. The lower the deposition temperature, the more tensile the tungsten will be, and the higher the deposition temperature, the less tensile. In one embodiment, an exemplary tungsten barrier plug 564 is disposed within approximately the next 9% to 13% of the total contact opening 556 height located above the adhesion layer 562. In a specific embodiment, the tungsten barrier plug 564 is approximately 150 to 200 angstroms thick at the bottom of opening 556 and approximately 70 angstroms wide near the sidewalls of opening 556. Depending on the desired structure, more or less tungsten barrier plug 564 may be deposited.

In one embodiment, a tungsten barrier plug 564 is disposed within contact opening 556 such that a portion of the tungsten barrier plug 564 is below gate dielectric layer 512 and adjacent to channel region 516. In yet another embodiment, additional tungsten barrier plug 564 is disposed within contact opening 556 such that a first portion of the tungsten barrier plug 564 is below gate dielectric layer 512 and a second portion of the tungsten barrier plug 564 is above gate dielectric layer 512.

Finally, as shown in FIG. 5I, the remainder of opening 556 is filled with a low resistance contact metal 566, such as, but not limited to, copper, in order to complete slot contact 568. In some embodiments contact metal 566 is grown electrolytically or electrolessly. Where contact metal 566 is comprised of Cu, a low resistance material such as a Cu seed layer may first be sputtered onto barrier plug 564 in order to assist the plating process.

In some embodiments, the low resistance contact metal 566 will be the principal conductive material in the slot contact 568 providing a low resistance contact to the source/drain contact region 540. In such embodiments, the volume of contact metal 566 in slot contact 568 is greater than the volume of barrier plug 564 in slot contact 568. In specific embodiments, the volume of contact metal 566 is greater than 75% of the overall volume of slot contact 168. In another embodiment, contact metal 566 is disposed within the top 75% to 90% of the total contact opening 556 height.

Figure 7A:
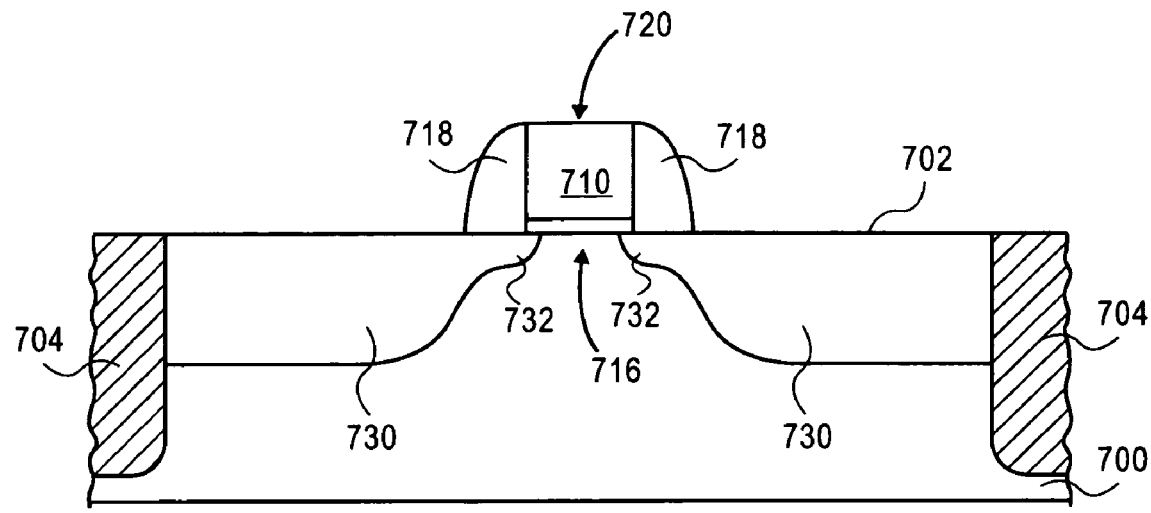
FIG. 7A illustrates a cross-sectional front view of a partially completed transistor with diffused tip and source and drain regions in accordance with the present invention.

FIGS. 7A-7E illustrate an alternative embodiment of the invention. FIG. 7A illustrates a partially completed surface channel transistor 720. Similar to the structure described in FIG. 5D, transistor 720 includes dielectric spacers 718, and gate stack 710 defining channel region 716 thereunder. Source and drain regions 730, tip regions 732, and isolation regions 704 may all be formed in substrate 700. In one embodiment, transistor 720 is a p-type transistor, substrate 700 is n-doped, and source and drain regions 730 and tip regions 732 are p-doped.

Figure 7B:
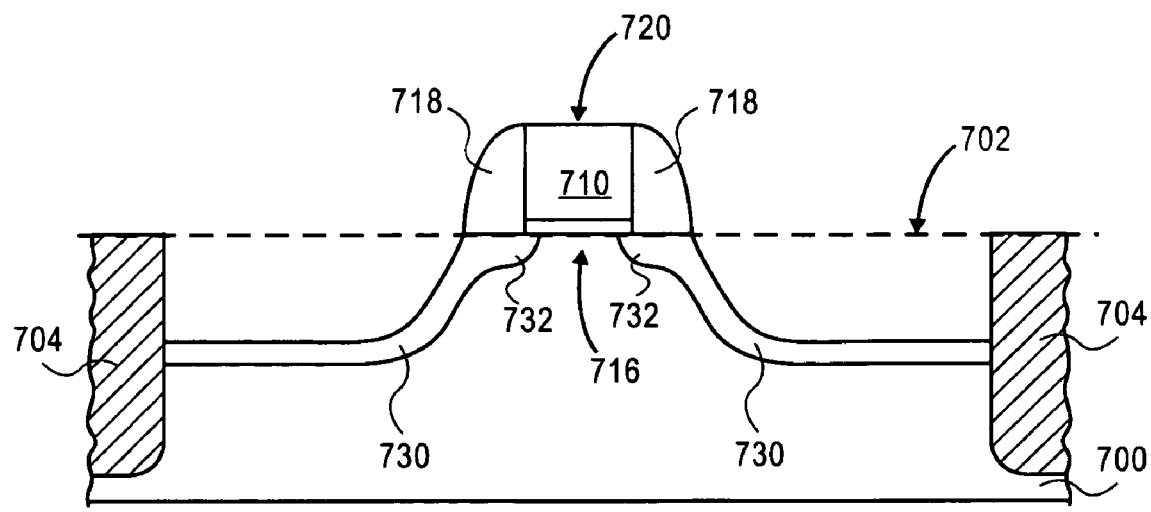
FIG. 7B illustrates a cross-sectional front view of recess etched source and drain regions in accordance with the present invention.

FIG. 7B illustrates the formation of recesses in source and drain regions 730. For example, source and drain regions 730 may be selectively etched using an etchant which selectively removes silicon over the other exposed materials of the structure of FIG. 7B. Thus, recesses are thereby etched into regions 730, and are aligned with the outer edges of dielectric spacers 718 and field isolation regions 704. In many embodiments recesses are etched isotropically. In one embodiment, a hydro-fluoride (HF) wet chemical etch can be used to form faceted recesses in source and drain regions 730. In a specific embodiment, source and drain regions 730 may be recess etched so that a portion of the recessed surfaces are located approximately 1,000 angstroms below the gate stack 710 and original surface 702.

Figure 7C:
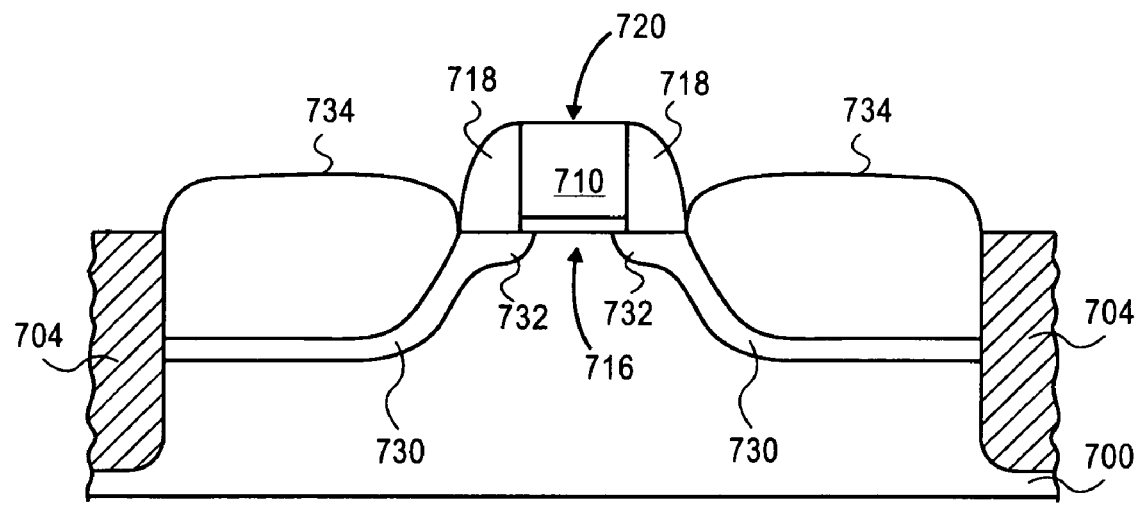
FIG. 7C illustrates a cross-sectional front view of source and drain films disposed within the recess etched source and drain regions of FIG. 7B.

FIG. 7C illustrates the formation of selectively deposited source and drain films 734. Source and drain films 734 are expitaxially formed in the recessed source and drain regions 730. In one embodiment, source and drain films 734 are lattice mismatched with respect to substrate 100 in order to transfer stress to channel region 716. For example, source and drain films 734 include silicon, germanium, and are in situ doped with boron. Source and drain films 734 maybe epitaxially deposited using a CVD chamber with the following processing conditions: dicholorsiline of 20 sccm, diborant of 70 sccm at 1% concentration, and germane of 50 sccm, at a temperature of approximately 740 C. In one embodiment, the germanium concentration in the source and drain films 734 is approximately 15-20%. The larger lattice constant of the SiGe film may induce a compressive stress on channel region 716.

In one embodiment, it is preferred that source and drain films 734 are raised source and drain films, that the top surface is above the gate oxide in gate stack 710. In such an embodiment, the source and drain films 734 are raised to minimize the stress transfer from the slot contact. In other embodiment, it is preferred to etch-back the source and drain films 734 so that a portion lies below the gate stack 710. In such an embodiment, the source and drain films 734 are recessed for optimal stress transfer from the slot contact.

Figure 7D:
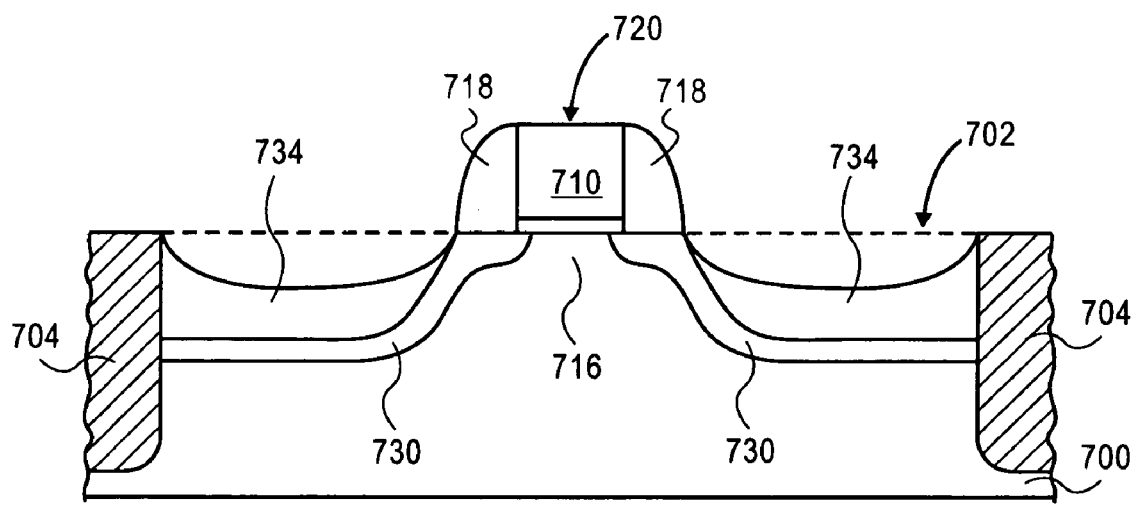
FIG. 7D illustrates a cross-sectional front view of recess etched source and drain films in accordance with the present invention.

FIG. 7D illustrates source and drain films 734 recess etched below gate stack 710. In one embodiment, source and drain films 734 are recess etched, so that after formation of contact regions 740 a portion of the source and drain films 734 recessed surfaces are located approximately 1% to 100% of transistor 720 gate length below the gate stack 710 and original surface 702. In a specific embodiment, when transistor 720 has a 45 nm gate length, source and drain region films 734 are recess etched so that a portion of the source and drain films 734 recessed surfaces are located approximately 350 to 400 angstroms below the gate stack 710 and original surface 702. After formation of approximately 5 to 10 nm thick contact regions 740, a portion of contact regions 740 are then located approximately 300 angstroms below the lower surface of gate stack 710 and original surface 702.

In an alternative embodiment, the structure in FIG. 7D can be obtained by deposition of source and drain films 734 such that they only partially fill the recessed source and drain regions 730; as opposed to deposition of raised source and drain films (as in FIG. 7C) followed by recess etch-back.

Figure 7E:
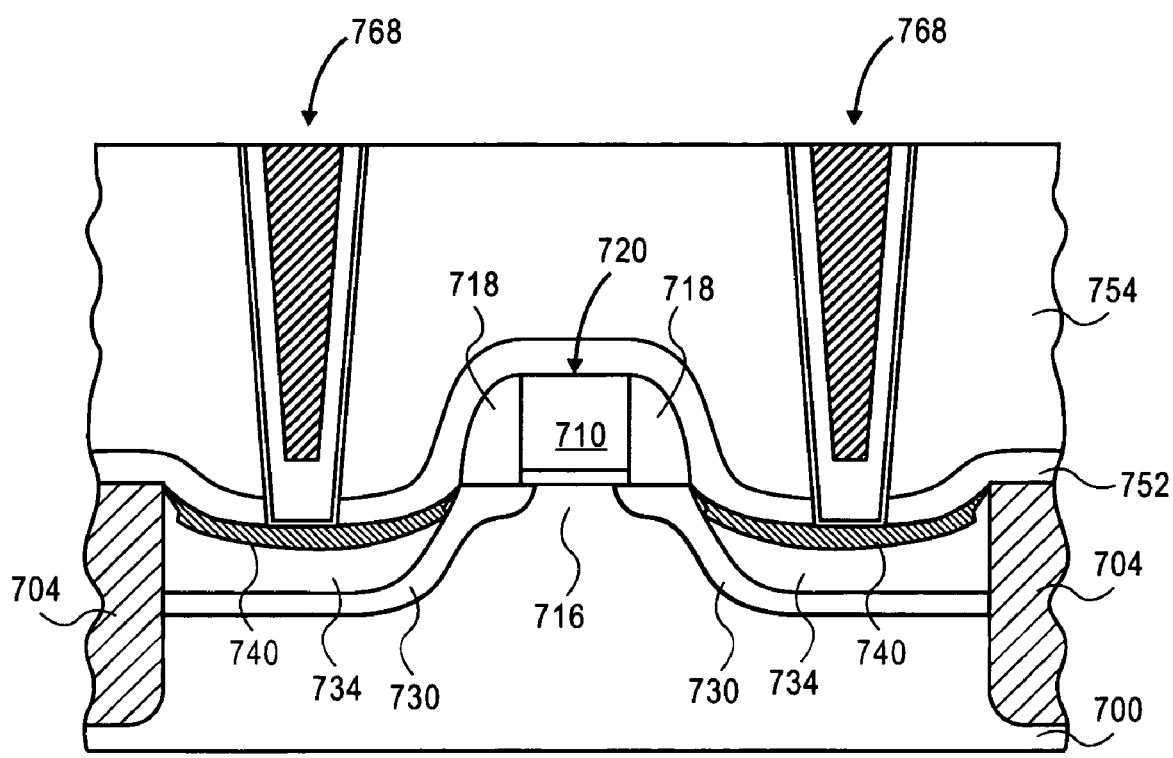
FIG. 7E illustrates a cross-sectional front view of an exemplary slot contact structure in accordance with the present invention.

FIG. 7E illustrates completed transistor 720 and slot contacts 768, after formation of contact regions 740 and dielectric layers 752 and 754. In one embodiment, slot contacts 768 make contact with contact regions 740 at approximately 1% to 100% of transistor 720 gate length below the gate stack 710 and original surface 702. In one embodiment, slot contacts 768 make contact with contact regions 740 at approximately 300 angstroms below the lower surface of gate stack 710 and original surface 702. In an embodiment, source and drain films 734 are lattice mismatched with respect to substrate 700. In one embodiment source and drain films 734 induce a compressive stress on channel region 716, and slot contacts 768 also induces a compressive stress on channel region 716. In an alternative embodiment, source and drain films 734 induce a tensile stress on channel region 716, and slot contacts 768 also induces a tensile stress on channel region 716.

Embodiments of the invention have been described herein where a contact structure provides a stress in a device channel region thereby increasing device performance. Specific embodiments have been measured to increase long channel drive by approximately 8% in both NMOS (with an induced tensile stress) and PMOS (with an induced compressive stress). Though when combined in CMOS architecture an intrinsically tensile stressed contact structure will provide an increase to the NMOS device while degrading the PMOS device by the same amount. This degradation can be prevented, however, by controlling the contact region location, size, shape, and by raising the source and drain regions of the PMOS device as shown in FIG. 8.

FIG. 8 illustrates an embodiment where both an NMOS and PMOS device are connected in a CMOS architecture. Slot contacts 868 all comprise an intrinsically tensile barrier plug. The NMOS transistor 820 includes source and drain regions 830, and contract regions 840 that are slightly recessed into the source and drain regions 830. While it is not required that the contact regions 840 are located below gate stack 810, it is preferred that slot contact 868 touch the contact region 840 below the level of the gate stack 810 so that the contact structure 868 can most effectively induce a tensile stress on the active channel region 816.

The PMOS transistor 821 includes raised source and drain films 834. For example, source and drain films 834 can be fabricating by well-known recess etch and deposition methods of in situ doped silicon and germanium. Contact regions 841 lie above gate stack 811 and active channel region 817. Accordingly, contact structure 868, while intrinsically tensile, does not induce a considerable tensile stress on the active channel region 817 because of the location. Thus, the degradation effect of the intrinsically tensile contact structure 868 is minimized in the PMOS device, and the same slot contact structure can be implemented for integrated NMOS and PMOS devices.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

The invention claimed is:

1. An n-type semiconductor device comprising:
   an n-type transistor including a gate stack and a contact region, the gate stack defining a channel region thereunder; and
   a slot contact in contact with a portion of the contact region below the gate stack, the slot contact including an intrinsically stressed barrier plug and a contact metal disposed on the barrier plug;
   wherein the barrier plug induces a tensile stress on the channel region; and
   wherein the slot contact spans across multiple transistors and the contact metal has a lower resistance than the barrier plug.

2. The device of claim 1, wherein the volume of contact metal is greater than the volume of barrier plug.

3. The device of claim 1, wherein the contact metal comprises at least 75% of the volume of the slot contact.

4. The device of claim 1, wherein the slot contact further comprises an adhesion layer.

5. The device of claim 1, wherein the slot contact is at least twice as long as it is wide.

6. A method of forming an n-type semiconductor device comprising:
   forming a plurality of n-type transistors, each including a gate stack and a contact region, the gate stacks defining channel regions thereunder;
   disposing a dielectric layer over the transistors;
   forming an opening in the dielectric layer to expose the contact regions, the opening extending below the gate stacks;
   disposing a barrier plug within a portion of the opening, the barrier plug inducing a tensile stress in the transistor channel regions; and
   filling the remaining of the opening with a contact metal which has a lower resistance than the barrier plug.

7. The method of claim 6, further comprising disposing an adhesion layer in the opening prior to disposing the barrier plug.

8. The method of claim 6, wherein disposing the adhesion layer comprises disposing a Ti and TiN bi-layer.

9. The method of claim 8, wherein disposing the Ti layer includes sputtering.

10. The method of claim 8, wherein disposing the TiN layer includes chemical vapor deposition.

11. The method of claim 6, wherein disposing the barrier plug includes chemical vapor deposition.

12. The method of claim 11, wherein chemical vapor deposition includes a WF6H precursor.

13. The method of claim 12, wherein chemical vapor deposition occurs between approximately 325 C and 425 C.

14. The method of claim 6, further comprising recess etching a portion of source and drain regions prior to forming the contact region.

15. The method of claim 14, wherein recess etching comprises isotropic wet etching.

16. The method of claim 6, wherein the barrier plug is disposed with a bottom-up fill process.

17. The method of claim 6, wherein filling the remaining of the opening with a contact metal comprises electroless growth of Cu.

18. The method of claim 6, wherein filling the remaining of the opening with a contact metal comprises electrolytic growth of Cu.

19. A method of forming an integrated semiconductor device comprising:
   forming a plurality of NMOS transistors each including a first gate stack and a first contact region, the first gate stacks defining first channel regions thereunder;
   forming a plurality of PMOS transistors each including a second gate stack and a second contact region, the second gate stacks defining second channel regions thereunder;
   disposing a dielectric layer over the NMOS and PMOS transistors;
   forming a first opening in the dielectric layer to expose the first contact regions of the NMOS transistors, the opening extending below the first gate stacks;
   forming a second opening in the dielectric layer to expose the second contact region of the PMOS transistors, wherein the second opening does not extend below the second gate stacks;
   disposing a barrier plug within a portion of the first and second openings, the barrier plug inducing a tensile stress on the first channel regions; and
   filling the remaining of the first and second openings with a contact metal which has a lower resistance than the barrier plug.

20. The method of claim 19, wherein the barrier plug is disposed with an intrinsic tensile stress.

21. The method of claim 19, further comprising disposing an adhesion layer in the first and second openings prior to disposing the barrier plug.

* * * * *